United States Patent [19]
Lin et al.

[11] Patent Number: 6,141,768
[45] Date of Patent: Oct. 31, 2000

[54] SELF-CORRECTIVE MEMORY SYSTEM AND METHOD

[75] Inventors: Shi-Tron Lin, Taipei; Ding-Yuan Yang, Hsinchu, both of Taiwan

[73] Assignee: Winbond Electronics Corp., Taiwan

[21] Appl. No.: 09/041,226

[22] Filed: Mar. 12, 1998

[51] Int. Cl.[7] .................................................. G06F 11/00
[52] U.S. Cl. ................................ 714/8; 714/7; 714/38
[58] Field of Search ..................... 714/710, 711, 714/5, 6, 7, 8, 25, 29, 30, 15, 34, 42, 38; 365/200, 201; 717/3, 4, 5, 6

[56] References Cited

U.S. PATENT DOCUMENTS

| | | | |
|---|---|---|---|
| 4,939,694 | 7/1990 | Eaton et al. | 365/200 |
| 5,200,959 | 4/1993 | Gross et al. | 714/723 |
| 5,278,847 | 1/1994 | Helbig, Sr. et al. . | |
| 5,579,266 | 11/1996 | Tahara . | |
| 5,644,541 | 7/1997 | Siu et al. . | |
| 5,661,732 | 8/1997 | Lo et al. | 714/725 |
| 5,844,910 | 12/1998 | Niijima | 714/710 |
| 6,006,313 | 12/1999 | Fukumoto | 711/211 |

*Primary Examiner*—Robert W. Beausoliel, Jr.
*Assistant Examiner*—Pierre Eddy Elisca
*Attorney, Agent, or Firm*—Raymond Sun

[57] ABSTRACT

A computer system is provided which performs a self-test of the memory cells of a memory device prior to loading of a computer program into the memory device, so as to determine the locations of defective memory cells. During loading of the computer program, each instruction step, data block and stack declaration is decoded, and the present invention creates and inserts a jump instruction into the original program code to bypass any defective memory cells without interrupting the intended operation of the instruction steps that are loaded into the memory. The loaded program code is then modified to correct any address-referencing that may be changed due to the insertion of the jump instructions. The present invention can even periodically perform a self-test procedure during the normal operation of the computer system so as to locate new defective memory cells and to modify the program code to bypass these newly-located defective memory cells.

36 Claims, 9 Drawing Sheets

| ORIGINAL MACHINE CODE | LOADED MACHINE CODE | ADDRESS-REFERENCING CORRECTION | MEMORY ADDRESS <>: DEFECTIVE | CORRESPONDING MICRO INSTRUCTIONS | |
|---|---|---|---|---|---|
| EB | EB | EB | 0000 | JMP | $+4 |
| 08 | 02 | 02 | 0001 | | |
| 00 | 90 | 90 | 0002 | NOP | |
| B1 | ?? | ?? | <0003> | NOP | |
| B2 | EB | EB | 0004 | JMP | $+10 |
| C3 | 08 | 08 | 0005 | | |
| C4 | 00 | 00 | 0006 | NULL | |
| E1 | B1 | B1 | 0007 | tab1(0) | |
| E2 | B2 | B2 | 0008 | | |
| E3 | C3 | C3 | 0009 | tab1(1) | |
| 8C | C4 | C4 | 000A | | |
| C8 | E1 | E1 | 000B | entry1 | |
| 8E | E2 | E2 | 000C | entry2 | |
| C0 | E3 | E3 | 000D | entry3 | |
| 2E | 8C | 8C | 000E | MOV | AX,CS |
| A0 | C8 | C8 | 000F | | |
| 07 | 8E | 8E | 0010 | MOV | ES,AX |
| 00 | C0 | C0 | 0011 | | |
| 42 | 2E | 2E | 0012 | CS: | |
| EE | A0 | A0 | 0013 | MOV | AL, [000B] |
| B0 | 07 | 0B | 0014 | | |
| E0 | 00 | 00 | 0015 | | |
| 3C | 42 | 42 | 0016 | INC | DX |
| FF | EB | EB | 0017 | JMP | $+3 |
| 74 | 01 | 01 | 0018 | | |
| 04 | ?? | ?? | <0019> | NOP | |
| B0 | EE | EB | 001A | OUT | DX,AL |
| 3F | B0 | B0 | 001B | MOV | AL,E0 |
| B4 | E0 | E0 | 001C | | |
| 4C | 3C | 3C | 001D | CMP | AL,FF |
| EE | FF | FF | 001E | | |
| --- | 74 | 74 | 001F | JZ | 002A |
| --- | 04 | 09 | 0020 | | |
| --- | EB | EB | 0021 | JMP | $+5 |
| --- | 03 | 03 | 0022 | | |
| --- | ?? | ?? | <0023> | NOP | |
| --- | 90 | 90 | 0024 | NOP | |
| --- | ?? | ?? | <0025> | NOP | |
| --- | B0 | B0 | 0026 | MOV | AL,3F |
| --- | 3F | 3F | 0027 | | |
| --- | B4 | B4 | 0028 | MOV | AH,4C |
| --- | 4C | 4C | 0029 | | |
| --- | EE | EE | 002A | OUT | DX,AL |
| --- | --- | --- | 002B | --- | |
| --- | --- | --- | 002C | | |

SELF-CORRECTIVE MEMORY SYSTEM AND METHOD

BACKGROUND OF THE INVENTION

1. Field of the Invention

The present invention relates to computer systems, and in particular, to a self-corrective system and method of loading program code into a memory having one or more defective memory cells.

2. Description of the Prior Art

Memory chips, such as dynamic random access memory (DRAM) devices, have now reached a high level of technological advancement in which these devices are now capable of storing over a million bits of information in a single semiconductor chip. Since each bit requires at least one transistor and associated circuitry to implement, even the best manufacturing fabrication lines will still turn out memory devices that have numerous bad parts, or memory cells. In the past, memory devices with bad memory cells were typically discarded, thereby resulting in waste and economic loss.

To address this problem, attempts were made to cause a memory device having some defective memory cells to behave as a defect-free memory device. One approach involved the actual repair of defective memory cells or addresses. Actual repair can be accomplished by providing a redundant or substitute memory to store data or program code intended for the defective memory cells or addresses in the memory device. Associated circuitry or software is provided to "link" the defective cells from the regular memory cells to the designated replacement cells in the redundant memory. Laser repair is used to "link" the defective addresses to the designated replacement addresses. Unfortunately, the provision of a redundant memory requires the inclusion of both the redundant memory and additional circuitry, which complicates the design and increases the cost of the memory device. In addition, this approach does not adequately address the situation where either or both the redundant memory and the additional circuitry may be defective.

Yet other attempts have provided memory devices that were both self-testing and self-correcting, such that the efficacy of regular memory cells can be tested while the memory device is in use, and any defective cells can be repaired or corrected by assigning corresponding replacement cells from the redundant memory to replace the defective cells. The location of defective memory cells can be located by any known testing procedure, such as, for example, by alternatively writing "1" and "0" in each bit location and then verifying the accuracy of the results. Again, these memory devices experience the same problems described above.

Figure 1:
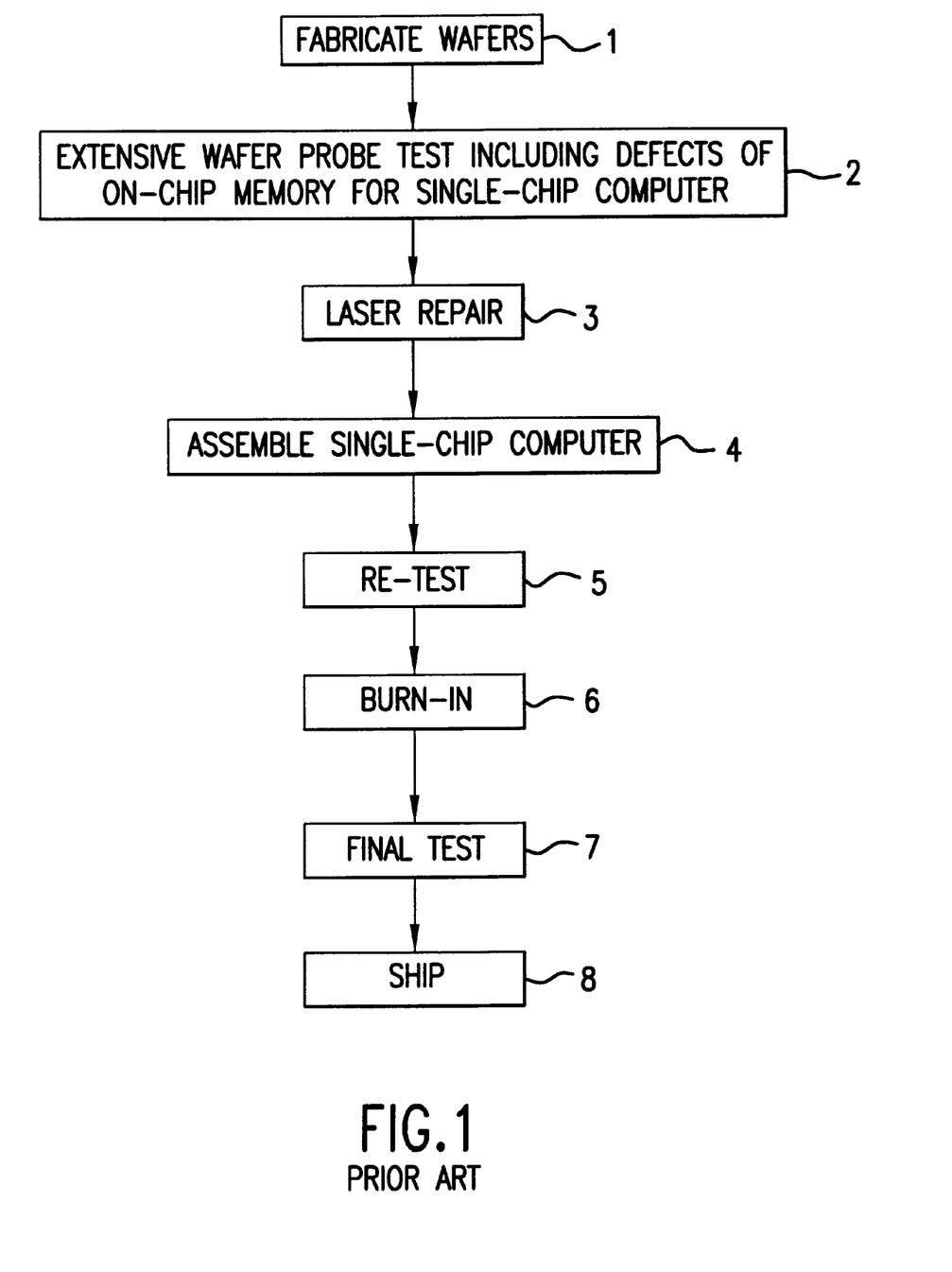
FIG. 1 illustrates a procedure for manufacturing prior art memory systems.

In addition, conventional memory devices that are provided in the form of an integrated circuit (IC) chip are typically put through an extensive testing procedure during manufacture thereof. FIG. 1 illustrates an example of such a testing procedure used for a single-chip microcomputer. Extensive testing of both the logic functions and the memory cells are performed at both the wafer level and at the assembled-package level, such as during steps 2, 5 and 7 of FIG. 1. Laser repair (step 3) can also be performed after the wafer-level testing of step 2.

Unfortunately, the testing of on-chip memory is very time-consuming since every memory cell must be tested. In contrast, the testing of logic functions on a chip is less intensive. Therefore, the testing of on-chip memory significantly increases the cost of manufacturing the memory devices.

SUMMARY OF THE DISCLOSURE

It is therefore an object of the present invention to provide a computer system and method which overcomes the above-referenced problems.

It is a further object of the present invention to provide a computer system and method in which memory devices having some defective memory cells are made to behave as a defect-free memory device.

It is yet another object of the present invention to provide a computer system and method which can be implemented without adding any additional hardware or memory cells.

It is still another object of the present invention to provide a computer system and method which eliminates the need for the testing of on-chip memory during manufacture thereof, thereby reducing the manufacturing time and costs.

It is yet a further object of the present invention to provide a computer system and method which eliminates the need for actual repair or correction of defective memory cells.

In order to accomplish the objects of the present invention, there is provided a computer system which performs a self-test of the memory cells of a memory device prior to loading of a computer program into the memory device, so as to determine the locations of defective memory cells. During loading of the computer program, each instruction step, data block and stack declaration is decoded, and the present invention creates and inserts a jump instruction into the original program code to bypass any defective memory cells without interrupting the intended operation of the instruction steps that are loaded into the memory. The loaded program code is then modified to correct any address-referencing that may be changed due to the insertion of the jump instructions. The present invention can even periodically perform a self-test procedure during the normal operation of the computer system so as to locate new defective memory cells and to modify the program code to bypass these newly-located defective memory cells.

In accordance with another aspect of the present invention, predetermined code sequences are assigned to "code units" so that the computer system of the present invention can distinguish instruction steps, data blocks and stack declarations from each other.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims. In certain instances, detailed descriptions of well-known circuits and components are omitted so as to not obscure the description of the present invention with unnecessary detail.

The present invention provides a computer system which performs a self-test of the memory cells of a memory device prior to loading of a computer program into the memory device, so as to determine the locations of defective memory cells. During loading of the computer program, each instruction step, data block and stack declaration is decoded, and the present invention creates and inserts a jump instruction into the original program code to bypass any defective memory cells without interrupting the intended operation of the instruction steps that are loaded into the memory. The loaded program code is then modified to correct any address-referencing that may be changed due to the insertion of the jump instructions. The present invention can even periodically perform a self-test procedure during the normal operation of the computer system so as to locate new defective memory cells and to modify the program code to bypass these newly-located defective memory cells.

Before further describing the embodiments and methods of the present invention, a brief background of conventional machine code and its processing will be provided. A computer program typically consists of executable machine code which is generated from the source code of a computer program by the operation of a compiler. This compiled machine code is typically stored in an input device, such as an on-chip Read Only Memory (ROM) or a hard drive, or an external memory device, such as a floppy disk, CD ROM, or tape. As the executable machine code is obtained or retrieved from the input device, the machine code is loaded into a dynamic memory (such as a RAM) for program execution. Machine code can include data segments, stack segments and code segments. A data segment comprises a number of data array declarations. A stack segment comprises a number of predetermined bytes for use as a data stack. A code segment comprises instruction steps. In addition, certain data declarations can reside in a code segment. A typical central processing unit (CPU) of a computer decodes and executes instruction steps in the following manner:

Fetch operand code→Decode→Fetch operand
addresses if necessary→Execute instruction Depending on the CPU, each instruction step may not have the same number of bytes. For example, certain CPUs use varied-length code words, while other CPUs use fixed-length code words.

Figure 2A:
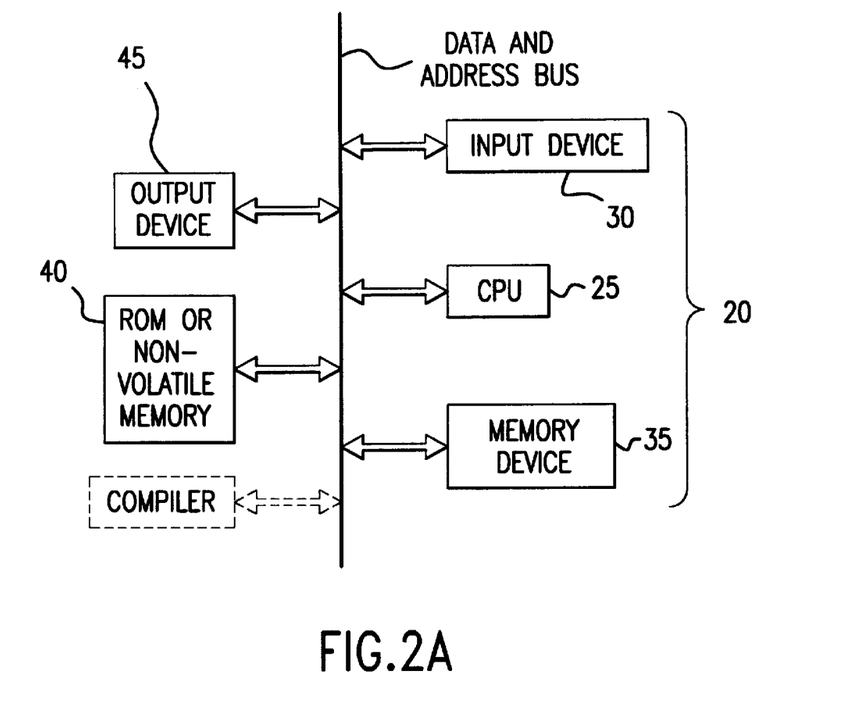
FIG. 2A is a general schematic view of a computer system according to an embodiment of the present invention.

FIG. 2A is a simple schematic illustration of a computer system 20 in which the present invention may be implemented. The computer system 20 may be implemented in the form of a microcomputer. The computer system 20 includes a CPU 25 which controls the loading of a computer program (which is stored in machine code format) from an input device 30 to a memory device 35 where the computer program is to be executed. The CPU 25 includes a compiler 40 that is responsible for decoding the source code of the computer program into machine code that the CPU 25 can read and execute. The CPU 25 also controls the execution of the computer program from the memory device 35. The input device 30 can be implemented in the form of an on-chip Read Only Memory (ROM) or a hard drive, or an external memory device, such as a floppy disk, CD ROM, or tape. In addition, the memory device 35 can be implemented in the form of a random access memory (RAM), either volatile or non-volatile. Examples of such volatile and non-volatile memories include an SRAM, a DRAM, a FeRAM, Flash, or EEPROM, among others. The computer system 20 also includes a ROM or other non-volatile memory 40, as well as an output device 45, such as a printer, monitor, computer screen, or other display device, which outputs and displays the images and results of the processing done by the computer program.

Figure 2B:
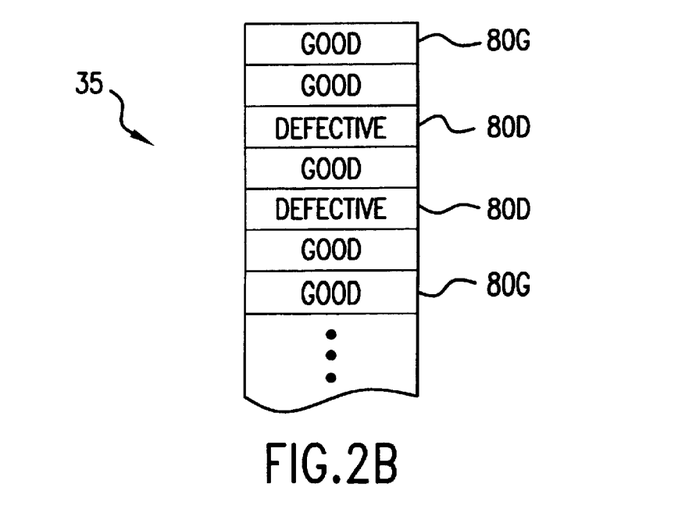
FIG. 2B is a simple illustration of a portion of the memory device of FIG. 2A.

A portion of the memory device 35 is illustrated in greater detail in FIG. 2B. The memory device 35 includes a plurality of memory addresses or cells 80 arranged sequentially. In a typical memory device 35, most of the cells 80 are good cells 80G. Unfortunately, there will usually be a few defective cells 80D. The present invention provides a system and method that operates to bypass the defective cells 80D, thereby causing the memory device 35 to behave as a defect-free memory device.

Figure 3:
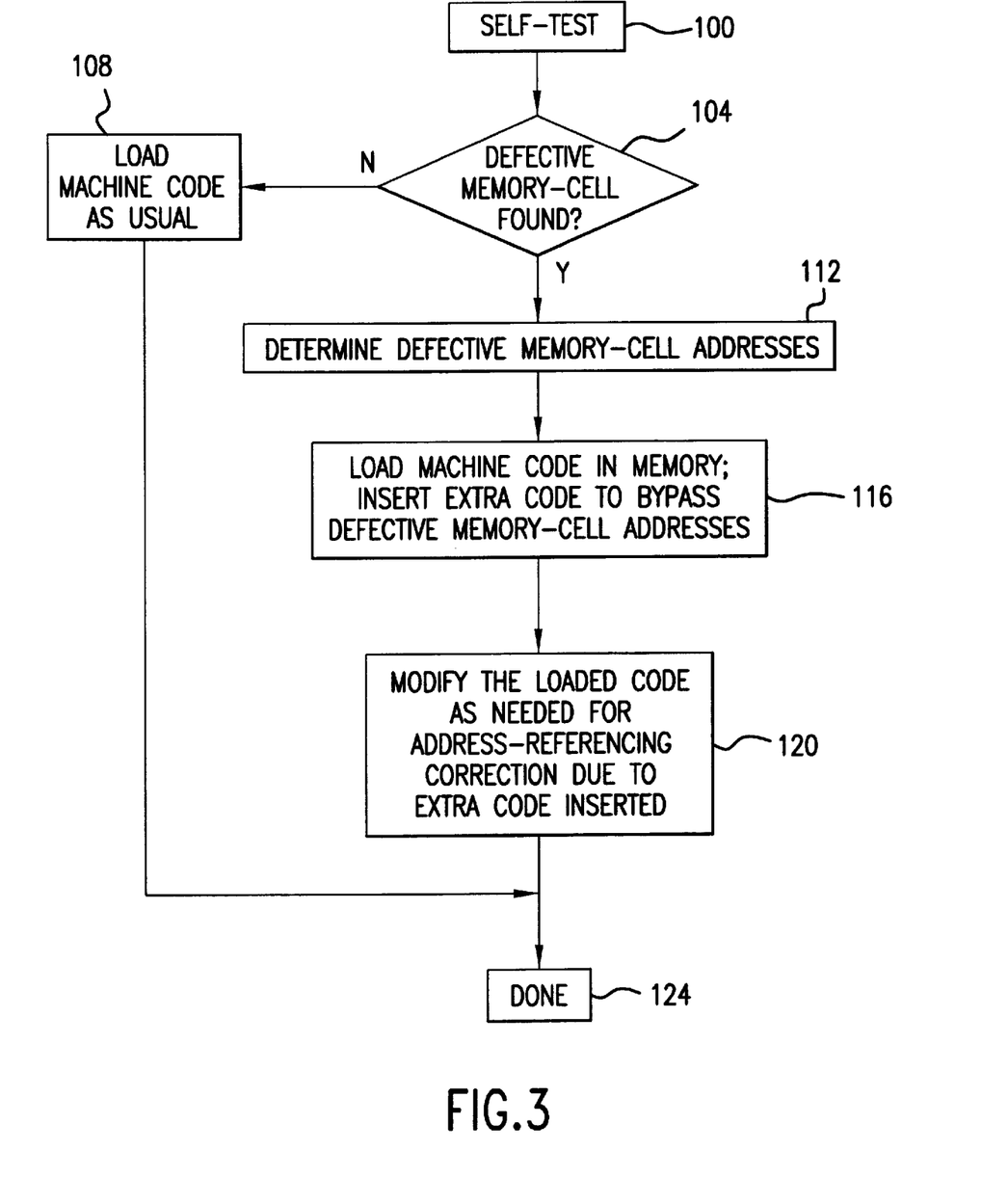
FIG. 3 is a flow-chart illustrating how the machine code of a program is loaded into the memory system of the present invention.

FIG. 3 illustrates how the machine code of a computer program is loaded into the memory device 35. In step 100, a self-test of the memory device 35 is performed before the machine code is loaded into the memory device 35. During the self-test, as shown in step 104, each memory cell 80 is tested to determine whether it is defective. If the memory device 35 does not contain any defective memory cells, then in step 108, the machine code is loaded into the memory device 35 according to conventional methods, after which the machine code will be ready for execution in step 124. On the other hand, if at least one defective memory cell 80D has been found, then in step 112, the location or address of each defective memory cell 80D is determined. The locations of defective memory cells 80D can be located by any known testing procedure, such as, for example, by alternatively writing "1" and "0" in each cell location and then verifying the accuracy of the expected results. The addresses of all defective memory cells 80D are stored in a non-volatile memory device, such as Flash/EEPROM, or alternatively, it can be stored in known good locations or cells of the memory device 35 or memory 40, for access by the CPU 25.

Next, in step 116, the machine code is loaded into the memory cells 80 of the memory device 35 in a manner in which no machine code is assigned to any defective memory cell 80D. In other words, the machine code is only loaded into good memory cells 80G. This is accomplished by modifying the original machine code to insert "JUMP" instructions into the original machine code to cause the machine code to bypass defective memory cells 80D during execution of the program, and will be described in greater detail hereinbelow.

Then, in step 120, the loaded machine code is checked for address referencing. The contents of certain bytes of the loaded machine code are modified as needed to reflect the different addresses resulting from the insertion of the "JUMP" instructions and the bypassed defective memory cells 80D. The machine code is then ready to be executed in step 124.

Figure 4:
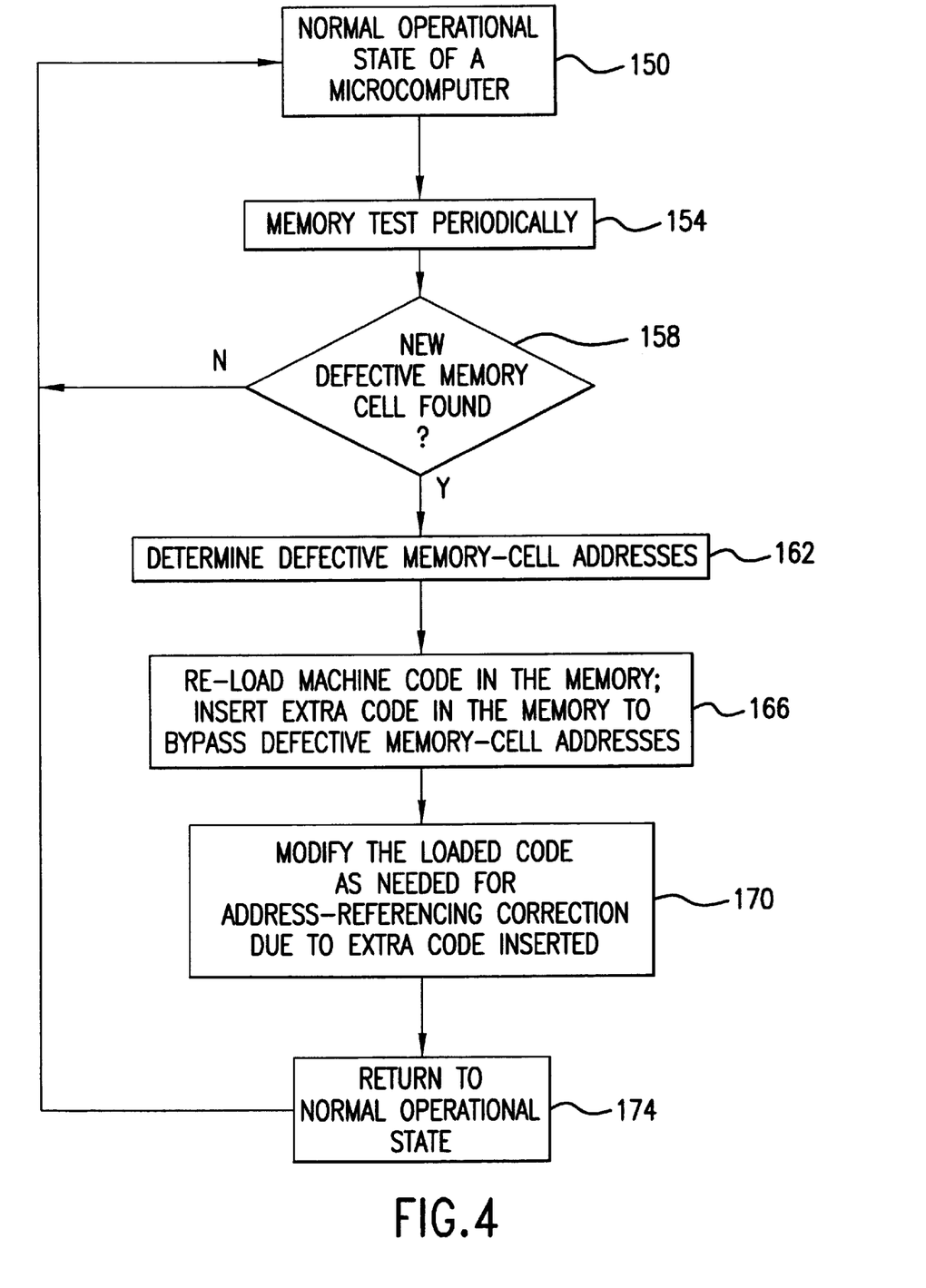
FIG. 4 is a flow-chart illustrating periodical self-testing of the memory system of the present invention.

FIG. 4 illustrates how the memory system of the present invention periodically self-tests the memory device 35. This self-test can be performed periodically between normal execution of the computer program (i.e., when the computer is idling or manually stopped). Such periodical self-testing is useful in locating memory cells that become defective after extended use. As illustrated in FIG. 4, in step 150, the computer or microcomputer may be in its normal operational state, in which it is executing the program. In step 154, between normal execution of the computer program, the CPU 25 decides to test the memory device 35. At this time, normal operation of the CPU 25 is interrupted, and in step 158, each good memory cell 80G is tested (using the testing method described above, for example) to determine whether any previously good memory cells 80G have become defective. If none of the previously good memory cells 80G are found to be defective, then the computer or microcomputer returns to its normal operational state in step 150.

On the other hand, if one or more previously good memory cells 80G is determined to be defective, then in step 162, the location or address of each newly-found defective memory cell 80D is determined. The addresses of the newly-found defective memory cells 80D are added to the list identifying all previously-known defective memory cells 80D as described above.

Next, in step 166, the machine code is re-loaded into the memory cells 80 of the memory device 35 in a manner in which no machine code is assigned to any currently-known defective memory cell 80D. As described above, this is accomplished by modifying the original machine code to insert "JUMP" instructions into the original machine code to cause the machine code to bypass defective memory cells 80D during execution of the program.

Then, in step 170, the re-loaded machine code is again checked for address referencing. The contents of certain bytes of the loaded machine code are modified as needed to reflect the different addresses resulting from the insertion of the "JUMP" instructions and the bypassed defective memory cells 80D. After the address references have been modified, in step 174, the computer or microcomputer returns to its normal operational state. The periodical re-testing of the memory device 35 can be initiated manually by the computer operator, or automatically by the system 20 at predetermined time intervals.

In carrying out the steps of the present invention, the additional code representing the "JUMP" instructions cannot be freely inserted into the machine code, since the additional code may be inadvertently inserted inside an instruction step, thereby interrupting a data sequence or changing the meaning of an instruction. Therefore, the present invention provides a mechanism for the system 20 to determine the appropriate insertion points for the additional code to be loaded into the memory cells 80 in a manner without changing the functionality of the original machine code.

As explained hereinabove, a typical CPU of a computer can determine the completion of an instruction step in the following manner:

Fetch operand code→Decode→Fetch operand addresses if necessary→Execute instruction However, the same process cannot be used to determine the existence of data bytes because a data byte can be interpreted by the CPU 25 as an erroneous operation code, and a number of bytes will then be erroneously fetched as operand addresses based on the erroneous operand code. As a result, the beginning and ending points of a data declaration or stack cannot be easily determined by the CPU 25 using the standard fetching and decoding process described above.

To allow the CPU 25 to correctly recognize and distinguish between complete data blocks, stack declarations and complete instruction steps, the present invention uses the novel concept of a "code unit". Thus, in the present invention, the entire machine code for the computer program is divided into a plurality of decodable "code units". A "code unit" can take the form of a complete instruction step (or microinstruction), a block of data declaration, or a block of bytes allocated for use as a stack. "Code units" comprising instruction steps are recognized by the CPU 25 using the standard fetching and decoding process described above. The latter two (data declaration blocks and stacks) can be headed by predetermined decodable code sequences. These code sequences can be pre-inserted into the source code of the program and then compiled in a normal fashion into executable machine code without affecting the functionality of the program. The pre-insertion can be done either manually (e.g., by the programmer), or automatically by an intelligent program that runs during source code compilation. Thus, an instruction step can be recognized by fetching and decoding the operand code. On the other hand, each entire block of data or stack can be recognized by the CPU 25 as a "code unit" by decoding the assigned code. According to one embodiment of the present invention, the predetermined code sequence can be a "JUMP" instruction followed by a NULL byte (i.e., "00"). Using an 80X86 series microprocessor as an example, the machine code of "EB 08 00" stands for a "JUMP" step which skips 8 bytes of data after the "JUMP" instruction. With a specific pre-determined byte (e.g., the NULL byte) after the "JUMP" instruction, the CPU 25 can recognize that this is either a stack or data block, and will know that additional code should not be inserted within the ten bytes (i.e., two bytes for the "EB" or "JUMP" instruction, and the eight bytes that are to be skipped) starting at the "JUMP" instruction. If the "JUMP" instruction is not followed by a null byte, then the CPU 25 recognizes that this does not represent a stack or data block, but is instead a regular "JUMP" instruction.

Figure 5:
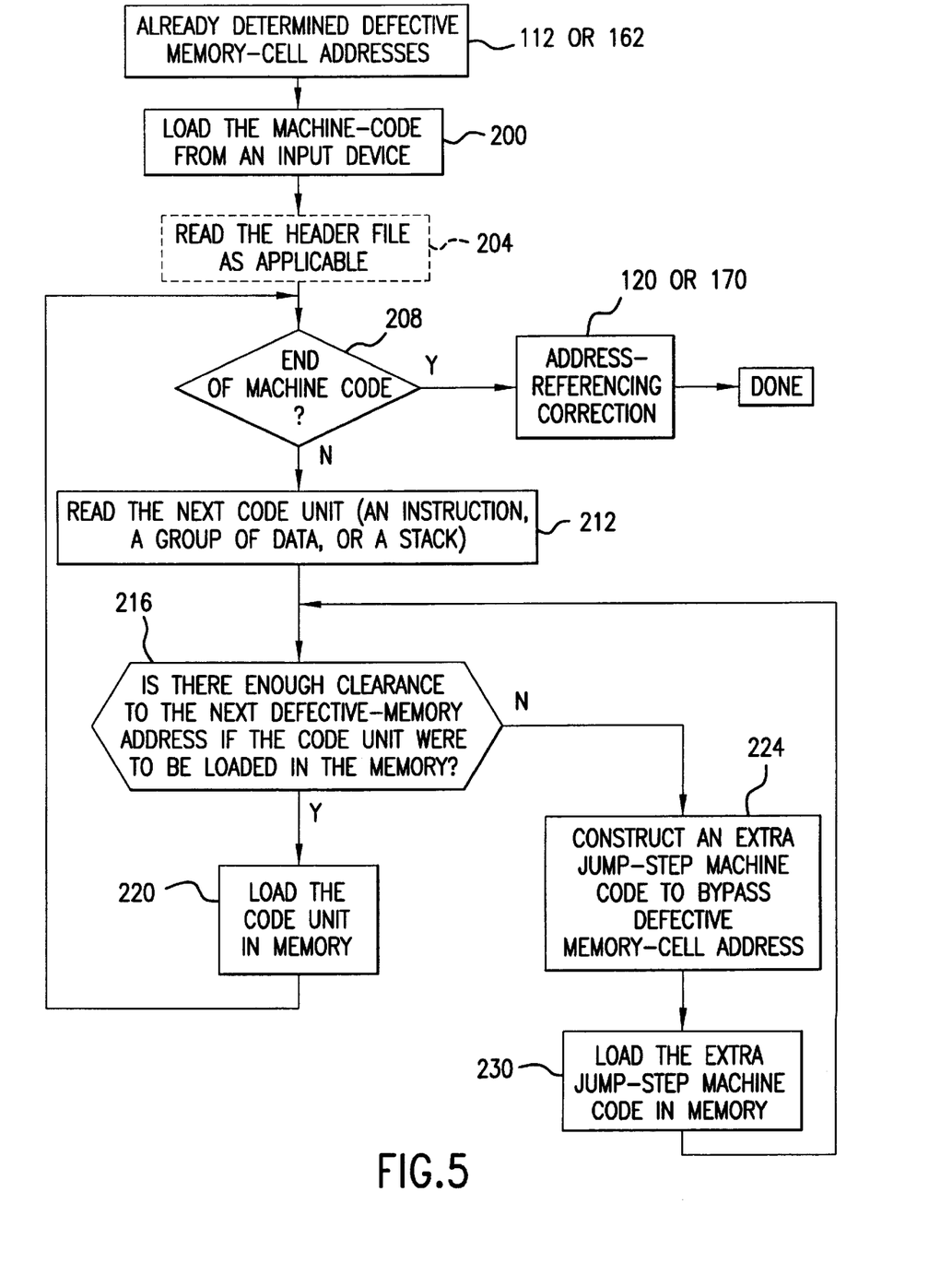
FIG. 5 is a flow-chart illustrating step 116 in FIG. 3 and step 166 in FIG. 4.

FIG. 5 illustrates in detail how step 116 in FIG. 3 and step 166 in FIG. 4 are performed. As shown in FIGS. 3, 4 and 5, in step 112 or 162, the addresses of the defective memory cells 80D have already been determined. Therefore, in step 200, the machine code representing the program is loaded from the input device 30 into the memory device 35. In step 204, the CPU 25 reads any header files that may exist. In step 208, the CPU 25 then checks to see if it has reached the end of the machine code. If yes, then operation is directed to step 120 or 170, where address referencing correction is performed. Otherwise, in step 212, the CPU 25 will read the next "code unit". As the machine code is being loaded on a byte-by-byte basis, "code units" comprising instruction steps are recognized by the CPU 25 using the standard fetching and decoding process described above, while "code units" comprising a data block or a stack declaration can be recognized based on the leading code sequences.

Next, in step 216, it is determined whether a "code unit" to be loaded into the memory device 35 has sufficient clearance before the address or location of the next defective memory cell 80D if this "code unit" were to be loaded into the memory device 35. If there is sufficient clearance, then in step 220, the "code unit" is loaded into the next available group of good memory cells 80G and operation is returned to step 208. If there is insufficient clearance, then in step 224, a "JUMP" step is constructed or created, and is loaded into the memory device 35 to bypass the next defective memory cell 80D. To construct this "JUMP" step, the CPU 25 first computes the number n of bytes of memory addresses that will need to be skipped to bypass the next defective memory cell 80D. Since defective memory cells 80D come in clusters, if adjacent defective memory cells 80D are located within a few cells of each other, the number n is made large enough to skip a cluster of closely-located defective memory cells 80D. For example, the number y can be used to designate the number of good memory cells 80G between adjacent or successive defective memory cells 80D. The number y can be chosen so that if y is less than a specific number (e.g., 5 or 10), then the number n will automatically be made large enough to skip the next two successive defective memory cells 80D. Next, the CPU 25 constructs the machine code for a "JUMP" instruction. In a 80X86 microprocessor, for example, the constructed machine code would be "EB x", where x=n−2 in Hex code. For example, if n=12, the two bytes "EB 0A" would have the "JUMP" step skip a total of ten bytes, which is exclusive of the two memory bytes occupied by the machine code for the "JUMP" instruction itself.

Once constructed, in step 230, the machine code for the "JUMP" instruction is loaded into the memory device 35. Operation then returns to step 216, where the CPU 25 checks again to see if there is sufficient clearance before the next defective memory cell 80D for the intended "code unit". Such an additional check is a safeguard to ensure that there is sufficient clearance. For example, if the number y is chosen to be 3, and the "code unit" to be loaded requires four or more bytes or memory cells 80, then the first "JUMP" instruction may not be sufficient. In such a situation, a second "JUMP" instruction would be constructed and loaded according to steps 224 and 230.

After sufficient clearance has been confirmed, the "code unit" to be loaded is then loaded into the memory device 35 at the correct memory cells 80G according to step 220, and operation is returned to step 208. The process continues until all the "code units" representing the machine code of the computer program have been loaded.

Figure 6A:
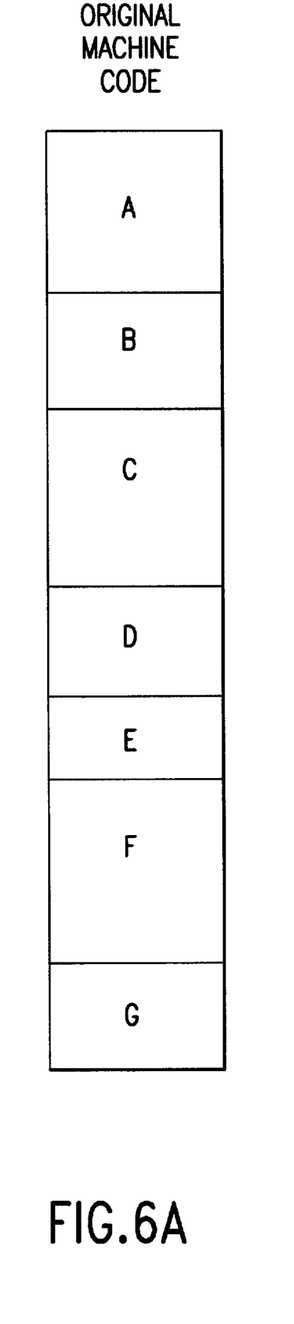
FIGS. 6A and 6B illustrate an example of the result of several "code units" loaded, according to the steps illustrated in FIG. 5, into a memory system having defective memory cells.
Figure 6B:
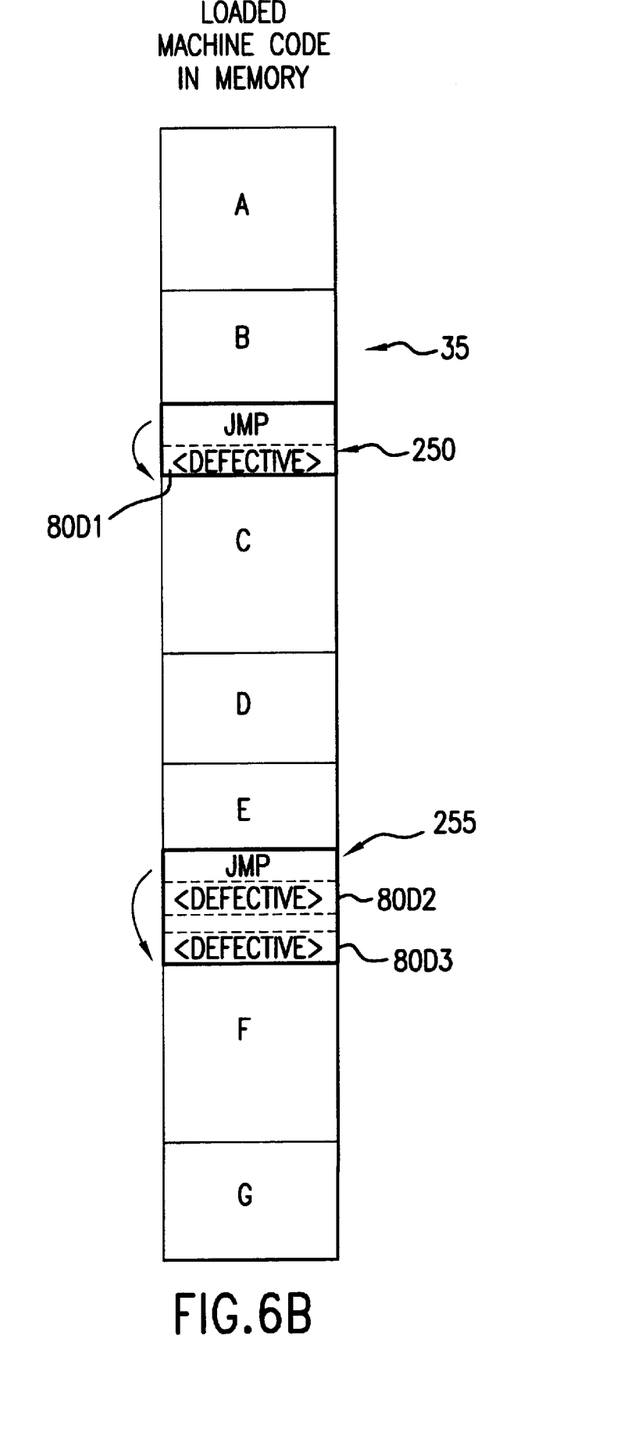

FIGS. 6A and 6B is a simple illustration of how "code units" A through G are loaded into a memory device 35 having defective memory cells 80D, using the process illustrated in FIG. 5. A "JUMP" instruction 250 is constructed and loaded into the memory address or cell 80 after "code unit" B to bypass a defective memory cell address 80D1. A second "JUMP" instruction 255 is constructed and loaded into the memory address or cell 80 after "code unit" E to bypass a group of two adjacent defective memory cell addresses 80D2 and 80D3 that are located one byte or memory address apart from each other.

Figure 7:
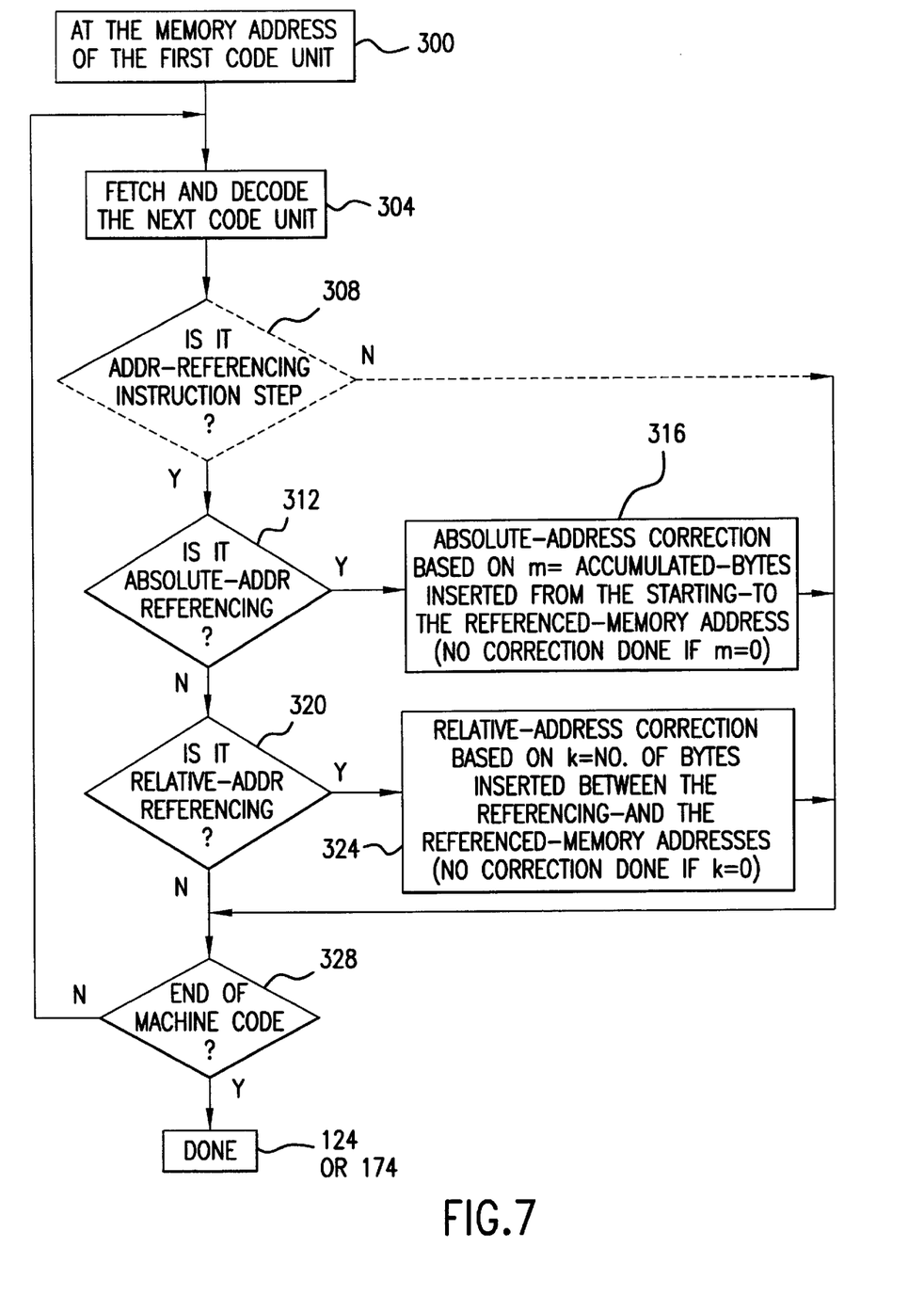
FIG. 7 is a flow-chart illustrating step 120 in FIG. 3 and step 170 in FIG. 4.

FIG. 7 illustrates in detail how step 120 in FIG. 3 and step 170 in FIG. 4 are performed. In step 300, the CPU 25 starts at the memory address or cell 80G where the machine code begins. In step 304, the first "code unit" is fetched and decoded. In step 308, it is determined whether the "code unit" is an instruction step having an operation code that specifies an address to be referenced. If the "code unit" is either a data block, a stack declaration, or an instruction step not having an operation code that specifies an address to be referenced, then operation proceeds to step 328 described below. Otherwise, in step 312, it is determined whether the address referencing associated with the instruction step of the "code unit" is absolute. If it is absolute addressing, then the number (i.e., the content of the bytes) in the operand represents an absolute address. Thus, in step 316, the byte contents are corrected by adding the number m to the number contained in the operand, with m equal to the accumulated number of bytes (i.e., the sum of all previous n) that had been inserted prior to the referenced memory cell or address 80. If m=0 (i.e., no prior skipped bytes), then no address referencing correction is needed. Operation then proceeds to step 328.

If the determination in step 312 reveals that the address referencing is not absolute addressing, then in step 320, it is determined whether the address referencing associated with the instruction step of the "code unit" is relative addressing. If it is relative addressing, then the number (i.e., the content of the bytes) in the operand represents an offset of two addresses: a target address and the current address. The offset changes if extra code (i.e., the "JUMP" instructions) is inserted between these two addresses. Thus, in step 324, the byte contents are corrected by adding the number k to the number contained in the operand, with k equal to the total number of bytes that had been inserted between the target address and the current address. Processing then proceeds to step 328, where the CPU 25 checks to see if the end of the machine code has been reached. If so, then the address referencing correction has been completed and processing proceeds to steps 124 or 174 (see FIGS. 3 and 4). Otherwise, the operation returns to step 304 to process the next "code unit", and repeats itself until all the "code units" have been processed.

Figure 8:
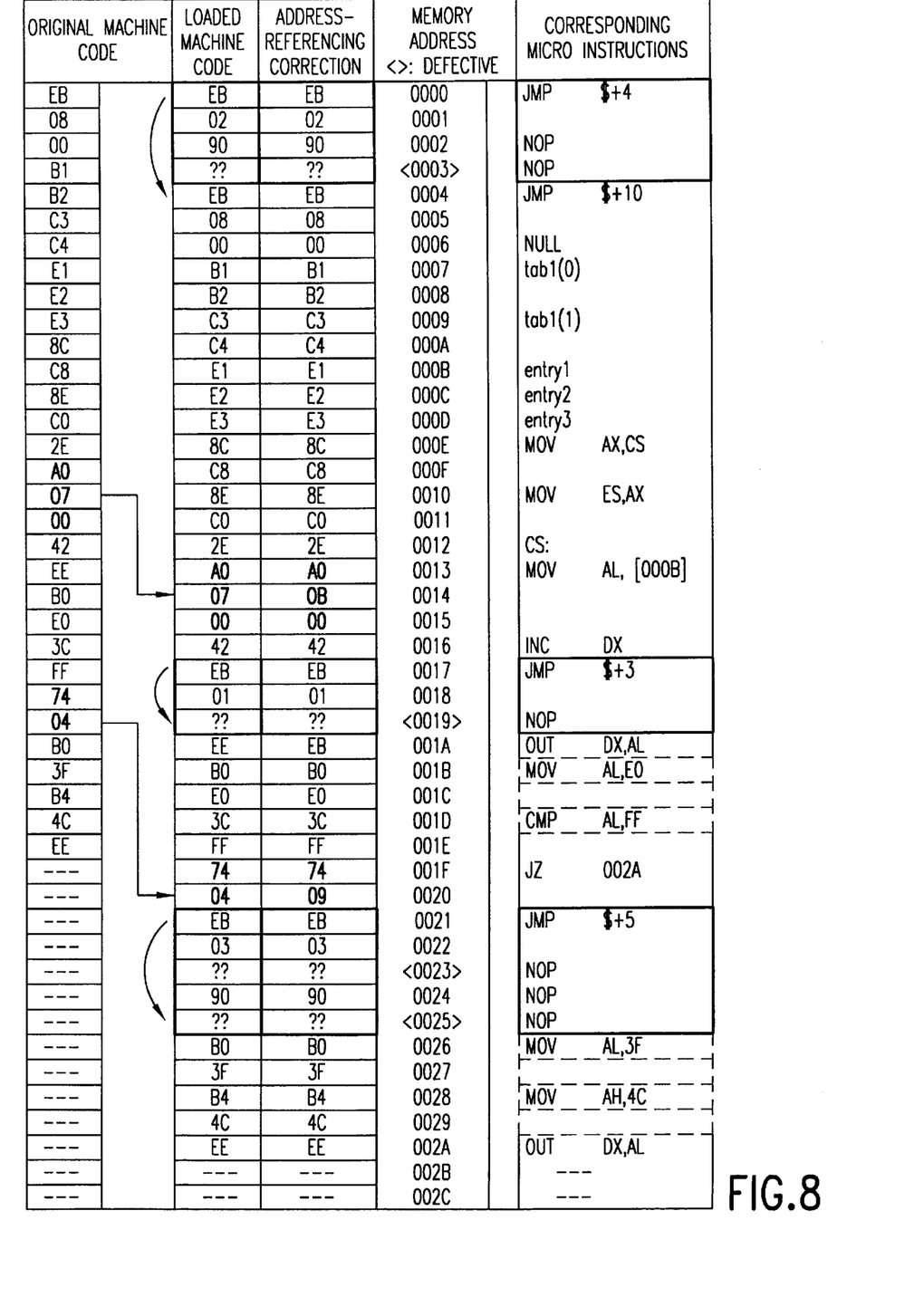
FIG. 8 is a table illustrating how a sequence of machine code is loaded according to the methods of the present invention.

The table of FIG. 8 provides an example illustrating the detailed operation of the methods described in connection with FIG. 3–7. The original machine code is set forth in the first column on the left side of the table. According to step 112, the defective memory cells 80D are determined to be 0003, 0019, 0023 and 0025, as indicated in the fourth column from the left side. The fifth column, or the right-most column, sets forth the instructions represented by the machine code. The clearance requirement y is set to be 2 bytes in this example. In fact, y must be at least 2 since each constructed "JUMP" step requires at least two bytes (i.e., memory cells 80) of memory for it to be inserted into the program.

In operation, the machine code is loaded according to steps 116 and 200. In step 212, the first "code unit" comprises a data declaration block, and is supposed to occupy the ten bytes of memory addresses 0000 to 0009. Based on the previously described code sequence method, the data block is preceded by a "JUMP" 30 instruction (i.e., "EB" in memory address 0000) followed by a NULL byte (i.e., "00" in memory address 0002), so the CPU 25 recognizes the entire data or stack block as a single "code unit". In step 216, since memory cell 0003 is defective, and the "code unit" requires ten bytes, it is determined that there is insufficient clearance. Thus, in step 224, a "JUMP" instruction is constructed to skip four bytes or addresses. In other words, the two bytes required for the "JUMP" instruction plus the two bytes to be skipped brings program execution to memory cell or address 0004. As a result, in step 230, the constructed "JUMP+4" instruction is represented in machine code by "EB 02" and is inserted in addresses 0000 to 0001, with address 0002 being assigned a "No operation" (NOP) code of "90". The first "code unit" is then loaded into addresses 0004–000D.

In accordance to step 212, the subsequent "code units" are instruction steps and are therefore recognized by the CPU 25 as "code units" using the standard fetching and decoding process described above. These "code units" are loaded into memory device 35 at addresses 000E–0016, according to steps 216 and 220. At address 0016, the CPU 25 recognizes that the next "code unit" is a one-byte instruction step "EE". This one-byte instruction step would normally be loaded into address 0017, but in step 216, the CPU 25 also recognizes that the next defective memory address is at 0019. Since a clearance of at least y=2 is required, there is insufficient clearance to the next defective memory address 0019, so according to step 224, a "JUMP" instruction is constructed to skip three addresses. In other words, the two bytes required for the "JUMP" instruction plus the one byte to be skipped brings program execution to memory cell or address 001A. As a result, in step 230, the constructed "JUMP+3" instruction is represented in machine code by "EB 01" and is inserted in addresses 0017 to 0019. The next "code unit" (i.e., "EE") is ready to be loaded into address 001A.

Now, in accordance to step 212, the subsequent "code units" are instruction steps and are therefore recognized by the CPU 25 as "code units" using the standard fetching and decoding process described above. These "code units" are loaded into memory device 35 at addresses 001A–0020, according to steps 216 and 220. At address 0020, the CPU 25 recognizes that the next "code unit" is a two-byte instruction step "B0 3F". This two-byte instruction step would normally be loaded into addresses 0021 and 0022, but in step 216, the CPU 25 also recognizes that the next defective memory address is at 0023. Since a clearance of at least y=2 is required, there is insufficient clearance to the next defective memory address 0023. The CPU 25 further recognizes that there is another defective memory address at 0025, so that the clearance between the adjacent defective addresses 0023 and 0025 is one, which is less than y=2. Therefore, according to step 224, a "JUMP" instruction is constructed to skip five addresses (i.e., the two bytes required for the "JUMP" instruction plus the three byte to be skipped brings program execution to memory cell or address 0026) to bypass the defective memory addresses 0023 and 0025. As a result, in step 230, the constructed "JUMP+5" instruction is represented in machine code by "EB 03" and is inserted in addresses 0021 and 0022, with address 0024 being assigned a NOP code of "90". The next "code unit" (i.e., "B0 3F") is then ready to be loaded into address 0026. This process is continued for the other "code units" of the machine code until all the "code units" have been loaded in the memory device 35 bypassing all defective memory addresses.

Next, the CPU 25 will modify the loaded machine code to correct the address references according to step 120. In step 300, the CPU 25 starts at the first "code unit", and in step 308, determines that the first "code unit" is for either a data or a stack declaration, so the CPU 25 goes on to the next "code unit". As the CPU 25 continues to fetch and decode the subsequent "code units" according to steps 304 and 308, it does not encounter any referencing instruction step until it fetches and decodes the instruction "A0 07 00" starting at address 0013. In step 312, the CPU 25 recognizes that the operation code "A0" is related to absolute address referencing, so in step 316, the instruction is modified to be "A0 0B 00". In other words, a total of n=4 bytes is added to the address "07" to obtain the new address "0B". In this case, based on the recorded number of bytes inserted and the insertion-point addresses, n is determined to be 4 because a total of four bytes were inserted by the "JUMP+4" instruction in addresses 0000–0003.

The CPU 25 then continues to fetch and decode the subsequent "code units" according to steps 304 and 308, and does not encounter any referencing instruction step until it fetches and decodes the instruction "74 04" starting at address 001F. In step 320, the CPU 25 recognizes that the operation code "74" is related to relative address referencing, so in step 324, the instruction is modified to be "74 09". In other words, the operand address "04" means that the target code address is five bytes addresses (i.e., "04"+1=5) higher than the current code address 0020. Based on the recorded number of bytes inserted and the insertion-point addresses, the CPU 25 determines that there are five bytes (i.e., at addresses 0021 through 0025) of additional code inserted between the current code address 0020 and the target code address which is five byte addresses higher. Thus, the content of the operand address "04" is increased by 5 bytes to obtain an operand address of "09". This process is continued for the other "code units" of the machine code until the address referencing for all the "code units" has been corrected.

Figure 9:
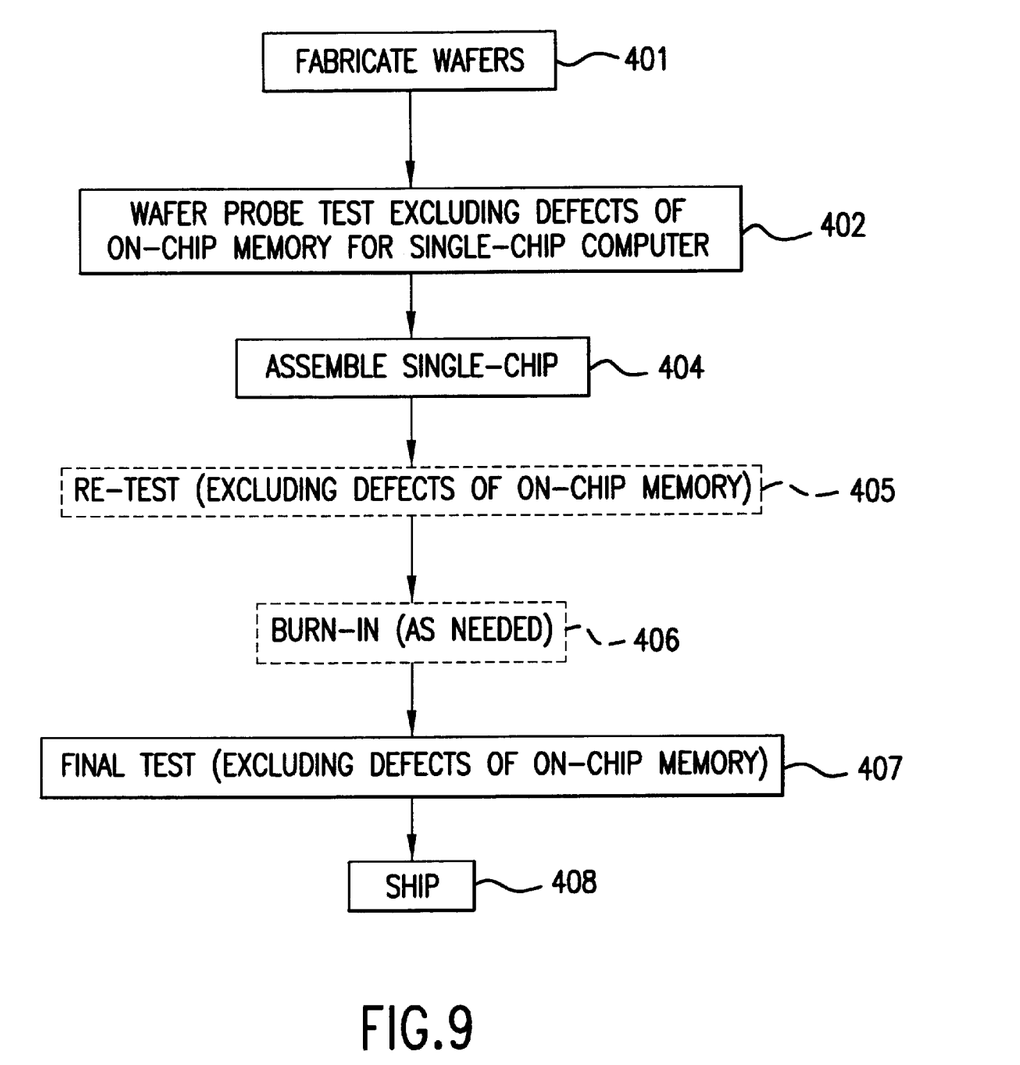
FIG. 9 illustrates a procedure for manufacturing a memory device according to an embodiment of the present invention.

FIG. 9 illustrates a procedure for manufacturing a memory device 35 according to an embodiment of the present invention. In this embodiment, the memory device 35 is part of a single-chip microcomputer, although the memory device 35 could be embodied differently, as described above. In step 401, the wafers are fabricated using known fabrication techniques. In step 402, a wafer probe test is conducted. This wafer probe test can include conventional DC testing to check for leakage or shorts, AC testing to check the viability of logic functions, and read/write sampling tests to check the viability of basic memory functions, among other conventional tests. However, the test does not include any testing of all memory cells to locate defective memory cells. In step 404, the single-chip is assembled, and is re-tested in step 405. The re-testing includes similar tests as for the wafer probe test, but again does not include any testing of all memory cells to locate defective memory cells. In step 406, burn-in of the chip is performed, on an as needed basis, using known techniques, and final testing of the chip is performed in step 407. Again, this final test includes similar tests as for the wafer probe test, but again does not include any testing of all memory cells to locate defective memory cells. Finally, in step 408, the chip is ready to be shipped. The testing performed in steps 405 and 407, though similar to the tests conducted during the wafer probe test, are generally less intensive. In addition, the re-test of step 405 and the burn-in of step 406 are optional and can be omitted if desired.

As illustrated in FIG. 9, the method of manufacture utilized by the present invention eliminates the need for the time-consuming testing of all memory cells in on-chip memory device 35 during manufacture thereof, thereby reducing the manufacturing time and costs. In particular, extensive testing of the memory device 35 is eliminated at three steps (compare steps 402, 405 and 407 of FIG. 9 with steps 2, 5 and 7 of the conventional method of FIG. 1), and no laser repair is needed. This benefit is facilitated by the method and system of the present invention, which provides periodical re-testing of the memory cells 80 during normal operation of the computer system, and which inserts additional code (e.g., the "JUMP" instructions), and re-loads and modifies the machine code, to skip defective memory addresses 80 that are identified. Thus, the system and method of the present invention provides memory devices which behave as defect-free memory devices even though they may include one or more defective memory cells. This is accomplished without adding additional hardware or memory cells, and without the need for actual repair or correction of defective memory cells.

Although the present invention is described as being used for general computer systems with either on-chip or off-chip memories, the present invention is particularly well-suited for use in a single-chip microcomputer environment.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. A method of loading machine code into a memory device for execution of the machine code in the memory device, the memory device having at least one defective memory cell, comprising the steps of:

(a) identifying the addresses of all defective memory cells in the memory device; and (b) loading machine code into the memory device by modifying at least part of the machine code to skip the defective memory cells and to load the machine code into memory cells other than the defective memory cells.

2. The method of claim 1, wherein step (b) further includes the steps of:

(b1) constructing a "JUMP" instruction to cause the execution of the machine code to skip the next defective memory cell; and (b2) inserting the "JUMP" instruction prior to the next defective memory cell.

3. The method of claim 2, further including the step of:

(c) modifying the loaded machine code by correcting one or more addresses referenced by one or more address-referencing instructions.

4. The method of claim 3, further including the steps of:

(d) periodically identifying the addresses of new defective memory cells in the memory device;

(e) re-loading machine code into the memory device by skipping all defective memory cells and loading machine code into memory cells other than the defective memory cells; and (f) modifying the re-loaded machine code by correcting the addresses referenced by certain instructions.

5. The method of claim 3, wherein step (c) further includes the step of:

correcting an absolute address in an instruction step by modifying the absolute address by a number dependent on the total number of memory cells that have been previously skipped.

6. The method of claim 3, wherein step (c) further includes the step of:

correcting a relative address in an instruction step by modifying the relative address by a number dependent on the total number of memory cells to be skipped between the current address and the target address contained in the relative address.

7. The method of claim 2, wherein the machine code comprises a plurality of code units, each code unit representing either an instruction step, a data block, or a stack declaration that may occupy a length of one or more memory cells, and wherein step (b1) further includes the steps of:

determining whether there are sufficient non-defective memory cells prior to the next defective memory cell to accomodate the length of the next code unit; and constructing and loading said "JUMP" instruction into the memory device if there are insufficient non-defective memory cells prior to the next defective memory cell to accomodate the length of the next code unit.

8. The method of claim 7, wherein step (b1) further includes the steps of:

determining whether there are sufficient non-defective memory cells between the next two successive defective memory cells to accomodate the length of the next code unit and a "JUMP" instruction;

constructing and loading said "JUMP" instruction into the memory device to skip the next two successive defective memory cells if there are insufficient non-defective memory cells between the next two successive defective memory cells to accomodate the length of the next code unit and a "JUMP" instruction.

9. The method of claim 7, wherein the constructed "JUMP" instruction includes a referenced memory address, further including the step of:

loading the next code unit at the memory address specified by the constructed "JUMP" instruction.

10. The method of claim 1, wherein the machine code comprises a plurality of code units, each code unit representing either an instruction step, a data block, or a stack declaration that may occupy a length of one or more memory cells, and wherein step (b) further includes the step of:

(b1) loading the machine code into the memory device one code unit at a time.

11. The method of claim 10, wherein step (b1) further includes the step of:

recognizing an instruction step code unit by executing a fetch and decode instruction.

12. The method of claim 11, further including the step of:

providing each data block code unit with a specific code sequence that includes a predetermined operation code followed by an operand address and a predetermined data byte.

13. The method of claim 12, further including the steps of:

providing said predetermined data byte as a NULL data byte; and determining the size of the data block code unit using said operand address.

14. The method of claim 11, further including the step of:

providing each stack declaration code unit with a specific code sequence that includes a predetermined operation code followed by an operand address and a predetermined data byte.

15. The method of claim 14, further including the steps of:

providing said predetermined data byte as a NULL data byte; and determining the size of the stack declaration code unit using said operand address.

16. A method of skipping defective memory cells in a memory device during the loading of machine code into the memory device, comprising of:

(a) loading machine code into the memory device for execution therein;

(b) construction a "jump" instruction in the loaded machine code to cause the execution of the machine code to skip the next defective memory cells; and (c) inserting the "jump" instruction prior to the next defective memory cell.

17. The method of claim 16, further including the step of:

(c) modifying the loaded machine code by correcting the addresses referenced by one or more instructions.

18. The method of claim 17, wherein step (c) further includes the step of:

correcting an absolute address in an instruction step by modifying the absolute address by a number dependent on the total number of memory cells that have been previously skipped.

19. The method of claim 17, wherein step (c) further includes the step of:
  correcting a relative address in an instruction step by modifying the relative address by a number dependent on the total number of memory cells to be skipped between the current address and the target address contained in the relative address.

20. The method of claim 16, wherein the machine code comprises a plurality of code units, each code unit representing either an instruction step, a data block, or a stack declaration that may occupy a length of one or more memory cells, and wherein step (a) further includes the step of:
  determining whether there are sufficient non-defective memory cells prior to the next defective memory cell to accomodate the length of the next code unit; and
  constructing and loading said "JUMP" instruction into the memory device if there are insufficient non-defective memory cells prior to the next defective memory cell to accomodate the length of the next code unit.

21. The method of claim 16, wherein step (a) further includes the step of:
  determining whether there are sufficient non-defective memory cells between the next two successive defective memory cells to accomodate the length of the next code unit and a "JUMP" instruction; and
  constructing and loading said "JUMP" instruction into the memory device to skip the next two successive defective memory cells if there are insufficient non-defective memory cells between the next two successive defective memory cells to accomodate the length of the next code unit and a "JUMP" instruction.

22. A memory system, comprising:
  a memory device having a plurality of memory cells, of which at least one memory cell is defective;
  means for identifying the addresses of all defective memory cells in the memory device; and
  means for modifying machine code; and
  means for loading the modified machine code into the memory device.

23. The memory system of claim 22, wherein the modifying means includes means for skipping the defective memory cells and loading machine code into memory cells other than the defective memory cells.

24. The memory system of claim 23, wherein the skipping means includes means for constructing a "JUMP" instruction to cause the execution of the machine code to skip the next defective memory cell.

25. The memory system of claim 22, further including means for modifying the addressing of the loaded machine code.

26. The memory system of claim 25, wherein the address modifying means includes means for correcting the addresses referenced by one or more instructions.

27. The memory system of claim 22, wherein the machine code comprises a plurality of code units, each code unit representing either an instruction step, a data block, or a stack declaration.

28. The memory system of claim 27, wherein each instruction step includes an operation code and operand addresses that are determined by the operation code.

29. The memory system of claim 27, wherein each data block code unit includes a specific code sequence that includes a predetermined operation code followed by an operand address and a predetermined data byte.

30. The memory system of claim 29, wherein the predetermined operation code represents a "JUMP" instruction, said said predetermined data byte is a NULL data byte, and the size of the data block code unit is determined using said operand address.

31. The memory system of claim 27, wherein each stack declaration code unit includes a specific code sequence that includes a predetermined operation code followed by an operand address and a predetermined data byte.

32. The memory system of claim 31, wherein the predetermined operation code represents a "JUMP" instruction, said said predetermined data byte is a NULL data byte, and the size of the stack declaration code unit is determined using said operand address.

33. A method of loading machine code into a memory device, comprising the steps of:
  dividing the machine code into a plurality of code units, each code unit representing either an instruction step, a data block, or a stack declaration that may occupy a length of one or more memory cells;
  recognizing an instruction step code unit by executing a fetch and decode instruction;
  providing each data block code unit with a specific code sequence that includes a predetermined operation code followed by an operand address and a predetermined data byte; and
  providing each stack declaration code unit with a specific code sequence that includes a predetermined operation code followed by an operand address and a predetermined data byte.

34. The method of claim 33, further including the steps of:
  providing said predetermined data byte for each data block code unit as a NULL data byte; and
  determining the size of the data block code unit using said operand address.

35. The method of claim 33, further including the steps of:
  providing said predetermined data byte for each stack declaration code unit as a NULL data byte; and
  determining the size of the stack declaration code unit using said operand address.

36. A method of loading machine code from an input device into a memory device, the machine code having a plurality of code units, each code unit representing either an instruction step, a data block, or a stack declaration that may occupy a length of one or more memory cells, the memory device having at least one defective memory cell, the method comprising the steps of:
  (a) identifying the addresses of all defective memory cells in the memory device; and
  (b) loading machine code into the memory device one code unit at a time, and by skipping the defective memory cells and loading machine code into memory cells other than the defective memory cells.

* * * * *